United States Patent
Sikka et al.

(10) Patent No.: US 12,431,404 B2
(45) Date of Patent: Sep. 30, 2025

(54) FATIGUE FAILURE RESISTANT ELECTRONIC PACKAGE

(71) Applicant: International Business Machines Corporation, Armonk, NY (US)

(72) Inventors: Kamal K. Sikka, Poughkeepsie, NY (US); Shidong Li, Hopewell Junction, NY (US); Tuhin Sinha, Oradell, NJ (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 17/097,607

(22) Filed: Nov. 13, 2020

(65) Prior Publication Data
US 2022/0157685 A1    May 19, 2022

(51) Int. Cl.
*H01L 23/34*    (2006.01)
*H01L 23/498*    (2006.01)

(52) U.S. Cl.
CPC ...... *H01L 23/345* (2013.01); *H01L 23/49822* (2013.01)

(58) Field of Classification Search
CPC .............. H01L 23/345; H01L 23/49822
See application file for complete search history.

(56) References Cited

U.S. PATENT DOCUMENTS

| | | | |
|---|---|---|---|
| 4,481,403 A * | 11/1984 | Del Monte | B23K 1/0004 219/209 |
| 5,539,186 A | 7/1996 | Abrami et al. | |
| 5,907,474 A | 5/1999 | Dolbear | |

(Continued)

FOREIGN PATENT DOCUMENTS

| | | |
|---|---|---|
| CN | 1705081 A | 12/2005 |
| CN | 102288335 A | 12/2011 |

(Continued)

OTHER PUBLICATIONS

Nguyen et al., "Fast Thermal Cycling-Enhanced Electromigration in Power Metallization," IEEE Transactions on Device and Materials Reliability, vol. 4, Issue 2, Jun. 2004, pp. 246-255. <https://www.researchgate.net/publication/3430030_Fast_Thermal_Cycling-Enhanced_Electromigration_in_Power_Metallization/download>.

(Continued)

*Primary Examiner* — Eugene Lee
(74) *Attorney, Agent, or Firm* — CHIP LAW GROUP

(57) ABSTRACT

A chip package comprises a chip having a first temperature sensor. The first temperature sensor is configured to measure a first temperature of the chip in a localized area around the first temperature sensor. The chip package also includes a chip carrier coupled to the chip via a plurality of solder connections. The chip carrier includes a second temperature sensor vertically aligned with the first temperature sensor. The second temperature sensor is configured to measure a second temperature of the chip carrier in a localized area around the second temperature sensor. The chip carrier further includes a localized heater element located near the second temperature sensor and configured to generate heat in response to a detected difference based on comparison of the first temperature and the second temperature such that the detected difference is adjusted in the localized area around the first temperature sensor.

18 Claims, 5 Drawing Sheets

(56) References Cited

U.S. PATENT DOCUMENTS

| | | | |
|---|---|---|---|
| 6,518,666 | B1 | 2/2003 | Ikeda |
| 8,786,396 | B2 | 7/2014 | Leung |
| 9,318,409 | B1 | 4/2016 | Reber |
| 9,627,291 | B2 | 4/2017 | Uekusa |
| 9,659,902 | B2 | 5/2017 | Wasserman |
| 9,761,543 | B1 * | 9/2017 | Male ................ H01L 23/49513 |
| 10,178,763 | B2 | 1/2019 | Yee |
| 10,260,961 | B2 * | 4/2019 | Ferguson ................ G01K 7/16 |
| 2002/0190337 | A1 | 12/2002 | House |
| 2005/0270049 | A1 | 12/2005 | Kishishita |
| 2008/0248610 | A1 | 10/2008 | Chew |
| 2011/0309357 | A1 | 12/2011 | Tain et al. |
| 2015/0311135 | A1 * | 10/2015 | Uekusa ................ H05K 1/0212 361/783 |
| 2016/0093549 | A1 * | 3/2016 | Reber ................ H01L 25/0657 219/494 |
| 2017/0287757 | A1 | 10/2017 | Kwasnick et al. |
| 2017/0354031 | A1 * | 12/2017 | Aoki ...................... H05K 3/341 |
| 2018/0203495 | A1 | 7/2018 | Campbell |
| 2018/0203496 | A1 | 7/2018 | Campbell et al. |
| 2019/0027413 | A1 | 1/2019 | Pozder |

FOREIGN PATENT DOCUMENTS

| | | |
|---|---|---|
| CN | 103576736 A | 2/2014 |
| CN | 114496942 A | 5/2022 |
| DE | 102021125607 A1 | 5/2022 |
| GB | 2605224 A | 9/2022 |
| JP | H05-243432 A | 9/1993 |
| JP | 2001-156246 A | 6/2001 |
| JP | 2003-188568 A | 7/2003 |
| JP | 2005-347487 A | 12/2005 |
| JP | 2008-244288 A | 10/2008 |
| JP | 2009-194270 A | 8/2009 |
| JP | 2015-207735 A | 11/2015 |
| JP | 2022-078954 A | 5/2022 |
| WO | 2018118262 A1 | 6/2018 |

OTHER PUBLICATIONS

Sakuma et al., "Differential heating/cooling chip joining method to prevent chip package interaction issue in large die with ultra low-k technology," 2012 IEEE 62nd Electronic Components and Technology Conference, May 29-Jun. 1, 2012, 3 pages.

Japan Patent Office, "Notice of Reasons For Refusal" Apr. 1, 2025, 08 Pages, JP Application No. 2021-169451.

The State Intellectual Property Office of People's Republic of China, "Office Action," Nov. 15, 2024, 24 Pages, CN Application No. 202111225248.4.

German Patent and Trademark Office, " Office Action," May 28, 2025, 10 Pages, DE Application No. 102021125607.0.

The State Intellectual Property Office of People's Republic of China, "Notification of Grant", Jul. 31, 2025, 4 Pages, CN Application No. 202111225248.4.

* cited by examiner

FATIGUE FAILURE RESISTANT ELECTRONIC PACKAGE

BACKGROUND

Electronic packages, also referred to herein as chip packages, are typically made of sub-components such as the chip, laminate, interconnects, lid, etc. These sub-components are often made up of different materials with different coefficients of thermal expansion (CTE). During the operation of the electronic package, the chip dissipates heat causing different temperatures in the package sub-components. The different temperatures and the different coefficients of thermal expansion of the materials can lead to differential expansion in the package components, causing warpage and stresses. The stresses can be highest near the chip corners. Repetitive cycling of the temperatures can lead to component fatigue failure. Interconnects between the chip and chip-carrier are especially susceptible to fatigue failure.

SUMMARY

Aspects of the disclosure may include a method of reducing temperature induced stresses in a chip package, an electronic device, and a chip package. One example of the chip package comprises a chip having a first temperature sensor located in a back end of the line level of the chip. The first temperature sensor is configured to measure a first temperature of the chip in a localized area around the first temperature sensor. The chip package also includes a chip carrier coupled to the chip via a plurality of solder connections. The chip carrier includes a second temperature sensor vertically aligned with the first temperature sensor in the chip. The second temperature sensor is configured to measure a second temperature of the chip carrier in a localized area around the second temperature sensor. The chip carrier further includes a localized heater element located near the second temperature sensor and configured to generate heat in response to a detected difference based on comparison of the first temperature and the second temperature such that the detected difference is adjusted in the localized area around the first temperature sensor.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1A:
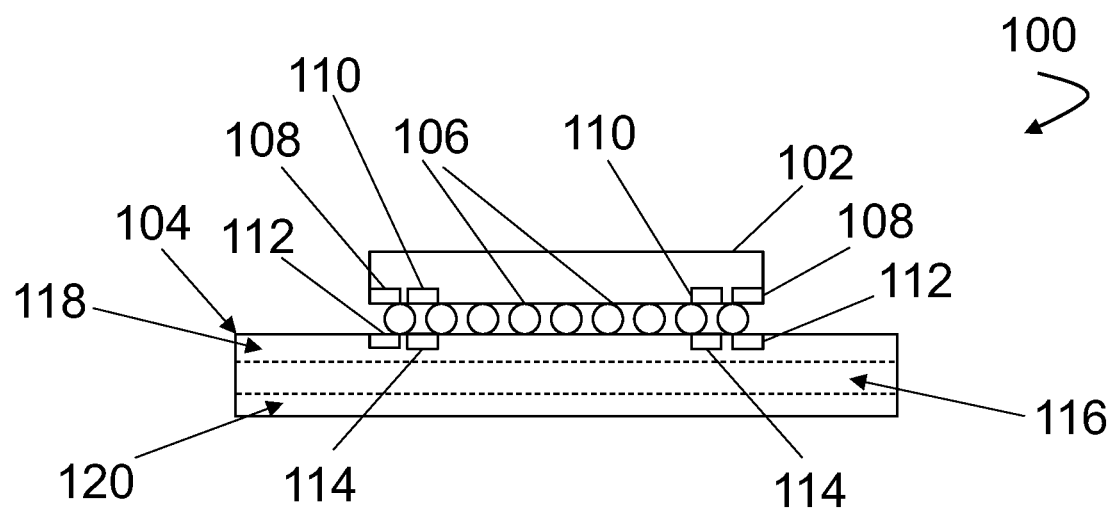
FIG. 1A is a high-level block diagram of a cross-section view of one example embodiment of an enhanced chip package.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Figure 1B:
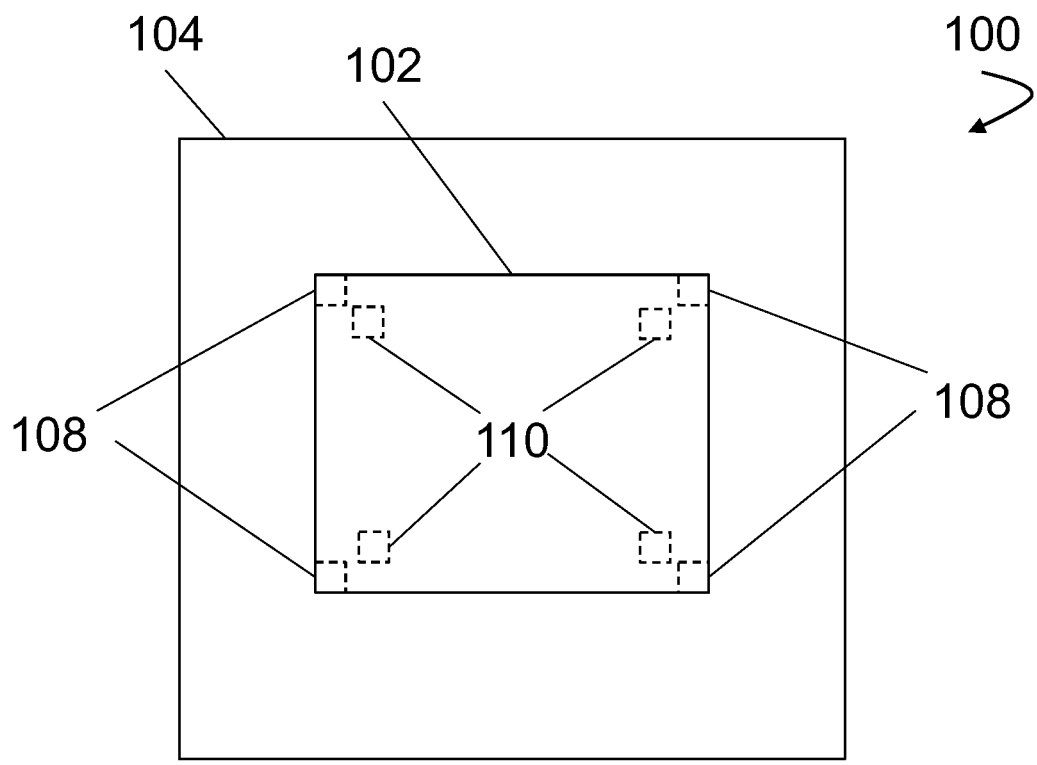
FIG. 1B is a high-level block diagram of a top view of the example embodiment of the enhanced chip package in FIG. 1A.
Figure 2:
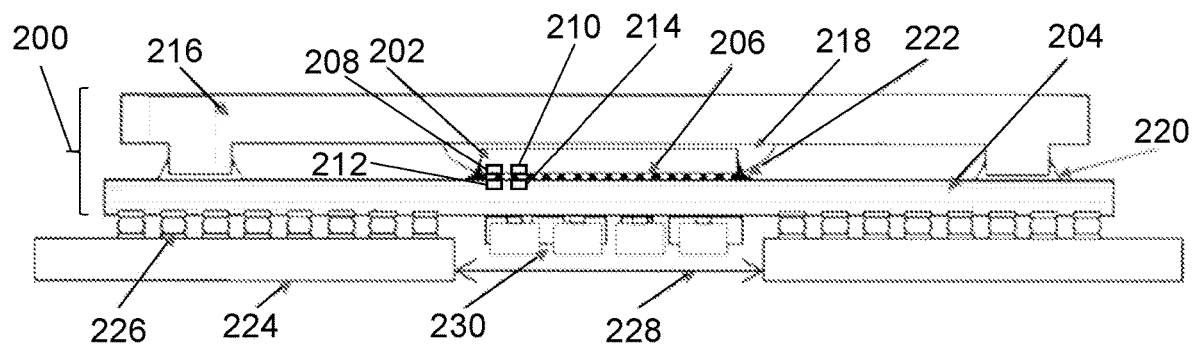
FIG. 2 is high-level block diagram of a cross-section view of another example embodiment of an enhanced chip package.

FIG. 1A is a high-level block diagram of a cross-section view of one example embodiment of an enhanced chip package 100. FIG. 1B is a high-level block diagram of a top view of the example embodiment of the enhanced chip package 100. It is to be understood that the enhanced chip package 100 is a simplified depiction and that enhanced chip packages according to the embodiments described herein can include other components not shown in FIG. 1A and FIG. 1B. For example, FIG. 2 depicts a more detailed cross-sectional view of an enhanced chip package 200.

The enhanced chip package 100 includes a chip 102 physically attached to a chip carrier 104 via connections 106 (also referred to herein as interconnections or interconnects). The interconnects 106 are implemented as controlled collapse chip connections (also known as C4 connections) using a plurality of solder balls, as known to one of skill in the art. Additionally, although not shown in FIG. 1A or FIG. 1B for ease of illustration and explanation, it is to be understood that chip 102 includes a plurality of electronic circuits, such as resistors, transistors, capacitors, inductors and/or diodes. As known to one of skill in the art, the electronic circuits can include analog and/or digital circuits. During operation, current flows through the plurality of electronic circuits which can cause temperature variations in the chip 102 at locations where current is flowing in the chip 102.

In some embodiments, the chip 102 is comprised of a first material having a first coefficient of thermal expansion (CTE) and the chip carrier 104 is comprised of a second material having a second CTE, which is different from the first CTE. For example, in some such embodiments, the chip 102 is comprised of a silicon material having a CTE of approximately 2.6 parts per million (ppm) per degree Centigrade (C) and the chip carrier 104 is comprised of one or more organic laminate materials having a composite CTE of approximately 13-17 ppm/C. In other embodiments, the chip carrier 104 can be comprised of a material having a CTE closer to the CTE of the chip 102. For example, in some embodiments, the chip carrier 104 can be comprised of a ceramic material having a CTE of approximately 3 ppm/C.

As discussed above, temperature variations can occur in the chip 102 and the chip carrier 104 during assembly and/or operation of the chip 102. The temperature variations are not uniform through the enhanced chip package 100. For example, the temperature in the chip carrier 104 can be different than the temperature of the chip 102. Additionally, different portions of the chip 102 and/or chip carrier 104 can be at different temperatures than other portions of the chip 102 and/or chip carrier 104, respectively. For example, as more current flows through certain portions of chip 102 than other portions, the temperature of the chip 102 will change based on the location of the current flow. Additionally, the temperature of the chip 102 can be different than the temperature of the chip carrier 104 due to the current flowing through the chip 102.

In a conventional chip package, these temperature variations cause stress on the components of the conventional chip package due, for example, to a CTE mismatch between the components. As the temperatures of the package components cyclically increases and decreases, the stresses generated in the package components can also cyclically increase or decrease which can lead to fatigue failure of the package components. The interconnects 106 between the chip 102 and the chip carrier 104, which can be made of solder materials, are especially vulnerable to fatigue failure.

Conventional techniques for attempting to minimize package interconnect stress can include attempting to minimize the component CTE mismatch through selection of materials, locally stiffening the substrate or chip carrier, and/or using an epoxy underfill material around the interconnects to reduce shear stress at chip corners.

Unlike conventional techniques, embodiments of the enhanced chip package 100 reduce stress in the interconnects 106 by responding to and adjusting temperature variations in the components of the chip package 100. In particular, one or more chip temperature sensors 108 and one or more chip heater elements 110 are included in the chip 102. Additionally, one or more carrier temperature sensors 112 and one or more carrier heater elements 114 are included in the chip carrier 104. The one or more carrier temperature sensors 114 are vertically aligned with a respective one or more chip temperature sensors 108. By vertically aligning the carrier temperature sensors 114 with respective chip temperature sensors 108, local temperature variations across the interconnects 106 can be measured at specific locations in the enhanced chip package 100.

For example, in the embodiment shown in FIG. 1A and FIG. 1B, the chip temperature sensors 108 are located at corners of the chip 102. Accordingly, the carrier temperature sensors 112 are located in the chip carrier 104 at locations which correspond to corners of the chip 102 in order to vertically align the carrier temperature sensors 112 with the chip temperature sensors 108. In this way, the sensors can be located at interconnect positions which are expected to experience more stress. For example, corners of the chip 102 often experience more stress than the center of the chip 102. However, it is to be understood that the embodiments described herein are not limited to placing sensors 108/112 at the corners of the chip 102. For example, in other embodiments, the sensors 108/112 can be located at locations corresponding to edges of the chip 102.

In addition, in the embodiment of FIGS. 1A and 1B, the chip heater elements 110 are also located in the corners of chip 102. Similarly, in this embodiment, the carrier heater elements 114 are also vertically aligned with the chip heater elements 110 and located in positions corresponding to the corners of chip 102. However, it is to be understood that, in some embodiments, chip heater elements 110 are omitted and only chip temperature sensors 108 are included in the chip 102. In some such embodiments, the carrier heater elements 114 are located close to respective carrier temperature sensors 112 which are vertically aligned with chip temperature sensors 108. Additionally, the carrier 104 in this example includes a central core 116, a front side level or top portion (also referred to as FC level) 118 and a bottom side level or bottom portion (also referred to as BC level) 120. In this example, the carrier temperature sensors 112 and the carrier heater elements 114 are located in the FC level 118 closer to the chip 102 and the chip temperature sensors 108 are embedded in a level in the back end of the line (BEOL) of the chip.

The chip temperature sensors 108 are configured to measure the temperature of the chip 102 at the respective location of the chip temperature sensors 108, such as during assembly and/or operation of the chip 102. Similarly, the carrier temperature sensors 112 are configured to measure the temperature of the carrier 104 at the respective location of the carrier temperature sensors 112, such as during assembly and/or operation of the chip 102.

Thus, the enhanced chip package 100 is configured to enable measuring localized values of temperature difference between the chip 102 and the chip carrier 104. As used herein, the term local or localized refers to a sub-portion of the chip 102 and corresponding area of the chip carrier 104 in an area around the temperature sensors 108/112 where the sub-portion is less than the entire chip 102 or chip carrier 104.

Furthermore, the enhanced chip package 100 is configured to reduce the stress exerted on interconnects 106 of the enhanced chip package 100 by selectively activating localized heater elements 110/114 to adjust the localized temperature of the chip 102 and/or chip carrier 104. For example, if a given pair of vertically aligned temperature sensors 108/112 identify that a temperature difference between the temperature of the sub-portion of the chip 102 in that localized area and the temperature of the corresponding portion of the chip carrier 104 is outside a predetermined range, then a heater element 114 and/or heater element 110 in that localized area can be activated to adjust the temperature of the chip carrier 104 and/or chip 102 until the measured temperature difference is brought within the predetermined range. Once the temperature difference is within the predetermined range, the heater element 114 and/or heater element 110 can be deactivated or turned off. In some embodiments, it is desired to minimize the temperature difference. Thus, in such embodiments, the predetermined range can be a range around zero. In other embodiments, it may be necessary to increase a localized temperature difference in order to reduce the stress placed on the interconnects. In some such embodiments, the predetermined range can be a range around a non-zero number or can be a range which excludes values around zero. The specific range used will vary based on details of the implementation of the enhanced chip package.

In this way, a control loop is used to reduce the stress exerted on the interconnects 106. It is to be understood that by using the plurality of localized and vertically aligned temperature sensors 108/112 and heater elements 110/114, the enhanced chip package is able to reduce both vertical temperature variation induced stresses and horizontal temperature variation induced stresses. That is, the enhanced chip package 100 is able to identify both temperature variations that occur vertically (e.g. between the chip 102 and the chip carrier 104) as well as horizontal temperature variations (e.g. between different portions of the chip 102 and/or different portions of the chip carrier 104).

In some embodiments, such as when the CTE of the chip 102 is closely matched to the CTE of the chip carrier 104, the enhanced chip package 100 is configured to adjust measured temperature differences. In other embodiments, such as when the CTE of the chip 102 is not closely matched to the CTE of the chip carrier 104, the enhanced chip package 100 is configured to modify the measured temperatures to adjust differences between the respective products of the measured temperatures and corresponding CTE values.

The comparisons of temperature values, modification of temperature values, and control of the heater elements 110/114 can be implemented using analog and/or digital electronic circuits coupled to the temperature sensors 108/112 and heater elements 110/114. For example, transistors can be interconnected to form logic gates, such as, but not limited to, AND gates, OR gates, XOR gates, etc. The logic gates can perform the above functionality, such as comparing outputs of the temperature sensors 108/112 as well as activating/deactivating heater elements 110/114 by controlling current to the heater elements 110/114 based on the comparisons of outputs of the temperature sensors 108/112. Thus, as described above, the enhanced chip package 100 is configured to dynamically reduce temperature induced stresses on components of the enhanced chip package 100 by using localized, vertically aligned temperature sensors 108/112 as well as corresponding heater elements 110/114.

Additionally, it is to be understood that the embodiment of FIG. 1A and FIG. 1B is provided by way of example, and that different embodiments can be implemented differently. For example, in some embodiments, heater elements 110 in the chip 102 are omitted since the chip 102 typically has a higher temperature than the chip carrier 104 during operation due to the current flowing through circuits on the chip 102. Furthermore, it is to be understood that the relative sizes of the components of enhanced package 100 depicted in FIG. 1A and FIG. 1B are provided for purposes of explanation only and are not to be construed as limiting. In particular, it is to be understood that various sizes of the components can be used. For example, in some embodiments, the chip 102 is approximately 25 mm by 29 mm and the chip carrier 104 is approximately 68.5 mm by 68.5 mm. However, it is to be understood that other sizes of the chip 102 and chip carrier 104 can be used in other embodiments.

Furthermore, in some embodiments, the heater elements 110/114 are 0.5 mm by 0.5 mm. In other embodiments, larger or smaller sizes for the heater elements 110/114 are used, such as, but not limited to, 1 mm by 1 mm or 20 μm by 20 μm. The heater elements 110/114 can be implemented as resistors which generate heat as current is applied to the resistors. The resistance needed for the heater elements 110/114 in such embodiments will vary based on various factors, such as the size of the heater elements 110/114, voltage level used, amount of power to be dissipated, etc. For example, in one embodiment using a voltage of 1.2 V and a 0.5 mm by 0.5 mm heater element, the heater element is selected to have a resistance of approximately 50-100 ohms. In another embodiment using a voltage of 1.2 V and a 1 mm by 1 mm heater element, the heater element is selected to have a resistance of approximately 30-60 ohms. Thus, the size and resistivity of the heater elements 110/114 will vary based on the specific implementation.

As discussed above, the enhanced chip package 100 of FIGS. 1A and 1B is a high-level block diagram for purposes of explanation and that other components can be included. One example enhanced chip package 200 depicting additional components is shown in FIG. 2. Although enhanced chip package 200 includes more components than the enhanced chip package 100, it is to be understood that enhanced chip package 200 is also simplified for purposes of illustration and explanation and that additional elements can be included and/or omitted in implementations of the embodiments described herein.

Enhanced chip package 200 includes a chip 202, a chip carrier 204, and interconnects 206 similar to chip 102, chip carrier 104, and interconnects 106 discussed above. Additionally, enhanced chip package 200 includes one or more chip temperature sensors 208, one or more chip heater elements 210, one or more carrier temperature sensors 212 vertically aligned with the one or more chip temperature sensors 208, and one or more carrier heater elements 214 similar to chip temperature sensors 108, chip heater elements 110, carrier temperature sensors 112, and carrier heater elements 114 discussed above.

In addition, enhanced chip package 200 shown in FIG. 2 includes a lid 216 overlaying the chip 202 and connected to the chip carrier 204. In particular, the lid 216 is separated from the chip 202 via a thermal interface material (TIM) 218 and connected to the chip carrier 204 via a seal 220, as known to one of skill in the art. The specific materials used for the TIM 218 and the seal 220 will vary based on the implementation of the chip package 200 as known to one of skill in the art. Additionally, FIG. 2 depicts an underfill material 222 around the interconnects 206. Suitable materials for and use of the underfill material 222 are known to one of skill in the art.

Additionally, the example shown in FIG. 2 depicts the enhanced chip package 200 coupled to a printed circuit board (PCB) 224 via a solder ball grid array (BGA) 226. Coupling a chip package to a PCB via a solder BGA is known to one of skill in the art and not described in more detail herein. The example of FIG. 2 also includes a PCB cutout 228 which provides space for additional backside components, such as capacitors 230, coupled to the bottom side level of the chip carrier 204. Thus, the enhanced chip package 200 can be integrated into one or more components of an electronic device. Other examples of chip package to PCB interconnections are Land Grid Array (LGA) or Pin Grid Array (PGA).

Figure 3:
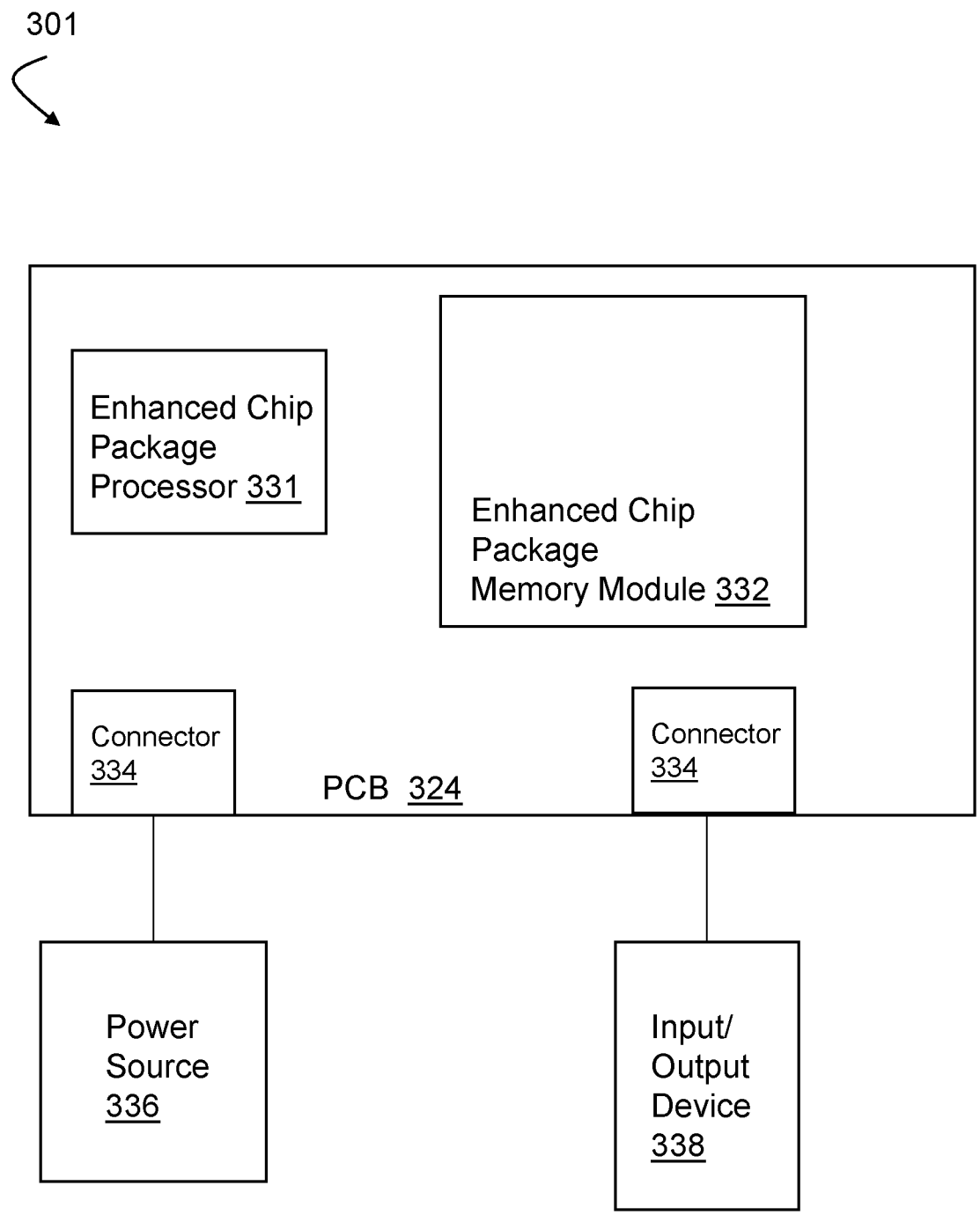
FIG. 3 is a high-level block diagram of an example electronic device.

Such components can include, but are not limited to, multi-core processors, application specific integrated circuits (ASIC), and memory modules, such as dynamic random access memory (DRAM) chips. For example, FIG. 3 is a high-level block diagram depicting one embodiment of an electronic device 301 utilizing enhanced chip packages. The electronic device 301 can be implemented as any suitable electronic device, such as, but not limited to, a personal computer, a server, a mobile device, a tablet, etc. By utilizing one or more enhanced chip packages, the operating life of the component of the electronic device can be increased due to the ability of the enhanced chip packages to reduce temperature induced stresses, such as corner stresses, which in turn reduces cyclic fatigue failure of interconnects, as discussed above.

As depicted in the example of FIG. 3, the electronic device 301 includes a PCB 324 on which is coupled a processor package 331 and a memory module 332. The processor package 331 is implemented using an enhanced chip package, such as the enhanced chip package 100 discussed above. Similarly, the memory module 332 is implemented using an enhanced chip packages, such as the enhanced chip package 100. The PCB 324 also include a plurality of connectors 334 configured to connect to one or more additional components, such as a power source 336 and one or more input/output devices 338. In some embodiments, the power source 336 is configured to provide the power needed to supply the current to heater elements and temperature sensors, such as heater elements 110/114 and temperatures sensors 108/112, to reduce the temperature induced stresses.

Figure 4:
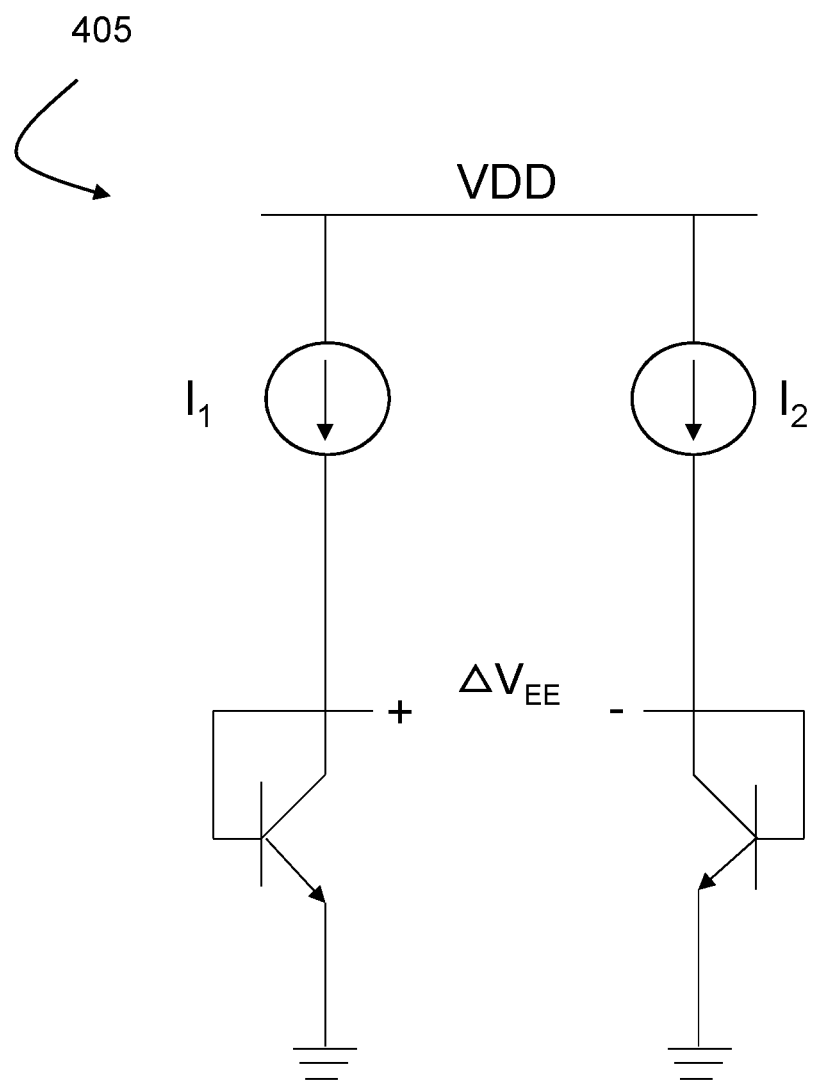
FIG. 4 is a circuit diagram of one embodiment of a temperature sensor.

FIG. 4 is a circuit diagram depicting one embodiment of a temperature sensor 405 which can be used to implement the temperature sensors 108/112 discussed above. The temperature sensor 405 is a pn junction-based on-chip temperature sensor diode (OCTS). As discussed above, the power source 336 can provide the supply voltage, VDD, in some embodiments. The differential output voltage, VEE, is proportional to the temperature if the ratio of the currents, I1 and I2, in the diodes is constant, as known to one of skill in the art. One of skill in the art is familiar with an OCTS and further details of the operation of the OCTS 405 is not described herein. It is to be understood that the OCTS 405 depicted in FIG. 4 is provided by way of example only and that other temperature sensors can be used in other embodiments, such as, but not limited to, metal wire resistive temperature devices (RTD) and/or thermistors.

Figure 5:
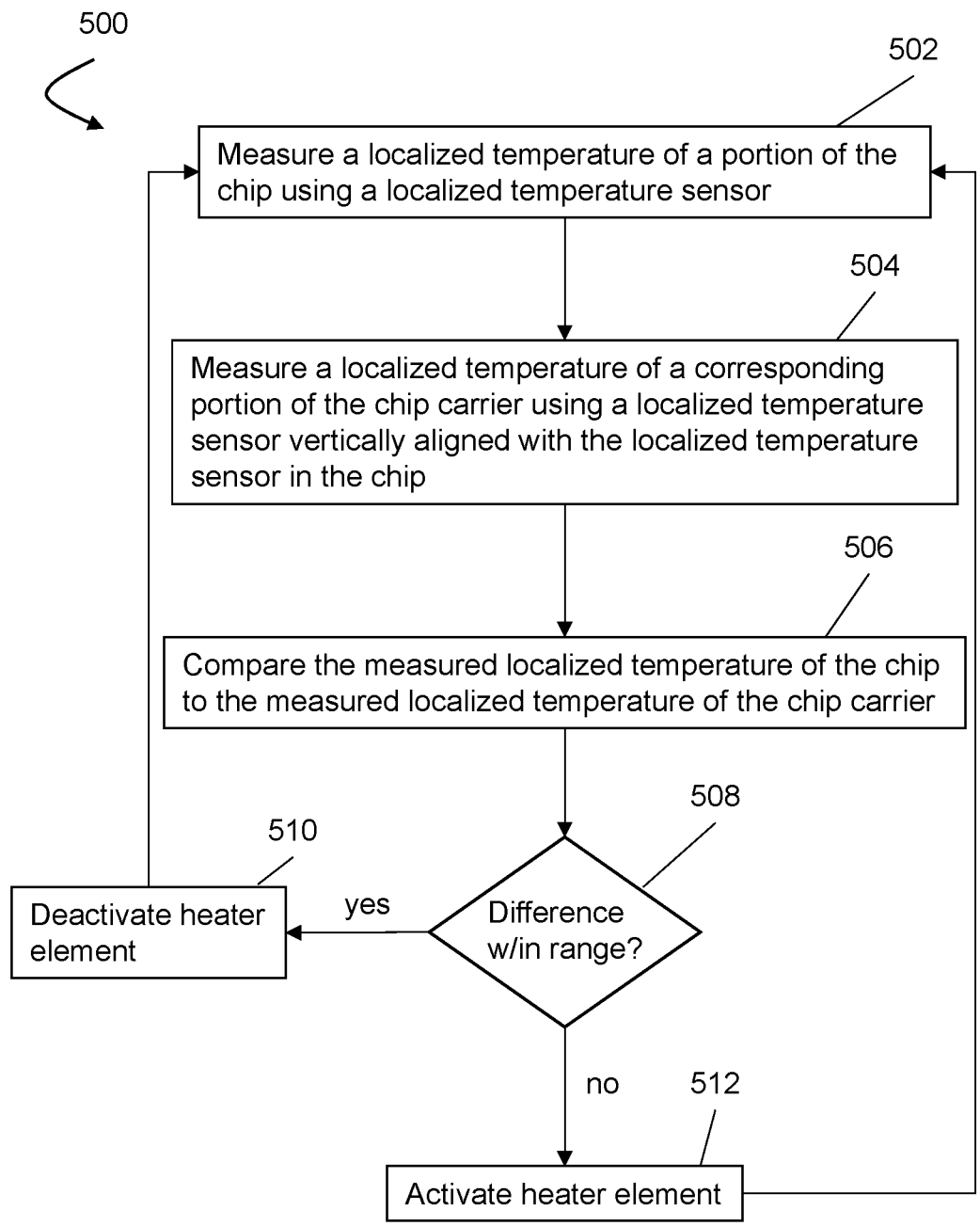
FIG. 5 is a flow chart depicting one embodiment of an example method of reducing temperature induced stresses in a chip package.

FIG. 5 is a flow chart depicting one embodiment of a method 500 of reducing temperature induced stresses in interconnects of a chip package, such as enhanced chip package 100. At 502, a localized temperature of a portion of the chip is measured using a localized temperature sensor. The temperature sensor can be located at a corner of the chip, in some embodiments. In other embodiments, the temperature sensor can be located along an edge of the chip. Furthermore, in some embodiments, a plurality of temperature sensors are included, such as at each of the corners of the chip, as discussed above. In addition, in the chip, the one or more temperature sensors are embedded in a level in the back end of the line (BEOL) in some embodiments.

At 504, a localized temperature of a portion of the chip carrier is measured using a localized temperature sensor located in the chip carrier. The temperature sensor in the chip carrier is vertically aligned with a temperature sensor in the chip, as discussed above. Thus, the temperature sensor in the chip carrier can be located at a position corresponding to a corner of the chip or along an edge of the chip, for example. In addition, the temperature sensor in the chip carrier is embedded in a front side level of the chip carrier, in some embodiments, as discussed above. The measured temperature values from multiple temperature sensors can be combined in a suitable mathematical algorithm, e.g., all the measured values can be averaged.

At 506, the measured localized temperature of the chip is compared to the measured localized temperature of the chip carrier. For example, a difference in the measured temperatures can be calculated in some embodiments. At 508, it is determined if a difference based on the comparison of the measured localized temperature of the chip to the measured localized temperature of the chip carrier is within a predetermined range, as discussed above. The difference can be a difference in the measured temperatures in some embodiments. In other embodiments, the difference can be a difference in the products of the respective CTEs and measured temperatures. Furthermore, in some embodiments, the range can be set to zero, such that any detected difference will be outside the range.

If the difference is within the range at 508, a localized heater element is deactivated at 510, if previously activated. Method 500 then returns to 502 to continue to measure the localized temperatures of the chip and the chip carrier. If the difference is not within the predetermined range at 508, a localized heater element is activated at 512 based on the comparison, as discussed above. For example, if the comparison determines that the chip carrier is cooler than the chip, a localized heater element in the chip carrier can be activated to bring the measured difference within the predetermined range. The heater element can be activated by providing a current to the heater element, as discussed above. Similarly, the heater element can be deactivated by removing the current to the heater element. Method 500 then returns to 502 to continue to measure the localized temperatures of the chip and the chip carrier.

It is to be understood that the order of the acts described in FIG. 5 can be implemented differently. For example, the measurement of the localized temperature at 502 can occur simultaneously as the measurement of the localized temperature at 504. Furthermore, it is to be understood that the method 500 can be implemented using analog and/or digital circuits implemented in chip, in some embodiments. Additionally, in other embodiments, the method 500 can be implemented in firmware embedded in the chip where the measured values are provided to circuitry configured to process instructions for operating on the measured temperature values.

In addition, it is to be understood that method 500 can be performed independently for each of a plurality of pairs of vertically aligned temperature sensors. For example, an enhanced chip package can include a plurality of temperature sensors in the chip and a plurality of corresponding temperature sensors in the chip carrier. Thus, method 500 can be performed for each of the pairs of the vertically aligned temperature sensors to provide localized temperature adjustments to reduce localized temperature induced stresses. Thus, the embodiments described herein enable the reduction of temperature induced stresses through the novel use of vertically aligned localized temperature sensors and heater elements which can improve the operating life of electronic components by reducing failure of the interconnects in the electronic components due to the temperature induced stresses.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A chip package, comprising:
    a chip having a plurality of first portions and a plurality of first localized temperature sensors, wherein
        a first location of each of the plurality of first localized temperature sensors corresponds to a respective portion of each of the plurality of first portions of the chip,
        each portion of the plurality of first portions has a different temperature and corresponds to a specific localized area around the respective localized temperature sensor of the plurality of first localized temperature sensors, and
        each of the plurality of first localized temperature sensors is configured to measure a first temperature of the respective portion of the plurality of first portions of the chip; and
    a chip carrier coupled to the chip via a plurality of solder connections, wherein
        the chip carrier includes a plurality of second portions and a plurality of second localized temperature sensors,
        a second location of each of the plurality of second localized temperature sensors corresponds to a respective portion of the plurality of second portions of the chip carrier,
        each of the plurality of second localized temperature sensors is vertically aligned with each of the plurality of first localized temperature sensors, each portion of the plurality of second portions has the different temperature and corresponds to a localized area around the respective localized temperature sensor of the plurality of second localized temperature sensors, each of the plurality of second localized temperature sensors is configured to measure a second temperature of the respective portion of the plurality of second portions of the chip carrier, the chip further includes a plurality of first localized heater elements, a third location of each of the plurality of first localized heater elements corresponds to a respective first localized temperature sensor of the plurality of first localized temperature sensors, a difference is detected for each portion of the plurality of first portions of the chip and a corresponding portion of the plurality of second portions of the chip carrier based on comparison of the first temperature and the second temperature, each of the plurality of first localized heater elements is configured to generate, based on the detected difference, heat in the respective portion of the plurality of first portions of the chip, and the difference for each portion of the plurality of first portions is adjusted based on the heat generated in the respective portion of the plurality of first portions of the chip.

2. The chip package of claim 1, wherein the detected difference is a temperature difference between the first temperature and the second temperature.

3. The chip package of claim 1, wherein the detected difference is a difference between:
the first temperature after modification of the first temperature by a first coefficient of thermal expansion (CTE) of the chip, and
the second temperature after modification of the second temperature by a second CTE of the chip carrier.

4. The chip package of claim 3, wherein
the chip further includes a silicon material having a CTE of approximately 2.6 parts per million (ppm) per degree Centigrade (C), and
the chip carrier further includes one or more organic laminate materials having a composite CTE of approximately 15 ppm/C.

5. The chip package of claim 1, wherein
the chip carrier further includes a plurality of second localized heater elements located within a vicinity of the plurality of second localized temperature sensors,
each of the plurality of second localized heater elements is configured to generate, based on the detected difference, heat in the respective portion of the plurality of second portions of the chip carrier, and
the difference for each portion of the plurality of first portions is adjusted based on the heat generated in the respective second portion of the plurality of second portions of the chip carrier.

6. The chip package of claim 1, wherein
each first localized temperature sensor of the plurality of first localized temperature sensors is an on-chip temperature sensor diode (OCTS), and
each second localized temperature sensor of the plurality of second localized temperature sensors is an OCTS.

7. The chip package of claim 1, wherein each first localized heater element of the plurality of first localized heater elements is a resistor configured to generate the heat based on application of a current to the resistor.

8. An electronic device, comprising:
a printed circuit board; and
an enhanced chip package coupled to the printed circuit board via a solder ball grid array, wherein the enhanced chip package includes:
a chip having a plurality of first portions and a plurality of first localized temperature sensors, wherein
a first location of each of the plurality of first localized temperature sensors corresponds to a respective portion of the plurality of first portions of the chip,
each portion of the plurality of first portions has a different temperature and corresponds to a specific localized area around the respective localized temperature sensor of the plurality of first localized temperature sensors, and
each of the plurality of first localized temperature sensors is configured to measure a first temperature of the respective portion of the plurality of first portions of the chip in a localized area around the first localized temperature sensor; and
a chip carrier coupled to the chip via a plurality of solder connections, wherein
the chip carrier includes a plurality of second portions and a plurality of second localized temperature sensors,
a second location of each of the plurality of second localized temperature sensors corresponds to a respective portion of the plurality of second portions of the chip carrier,
each of the plurality of second localized temperature sensors is vertically aligned with each of the plurality of first localized temperature sensors,
each portion of the plurality of second portions has the different temperature and corresponds to a localized area around the respective localized temperature sensor of the plurality of second localized temperature sensors,
each of the plurality of second localized temperature sensors is configured to measure a second temperature of the respective portion of the plurality of second portions of the chip carrier,
the chip carrier further includes a plurality of first localized heater elements,
a third location of each of the plurality of first localized heater elements corresponds to a respective second localized temperature sensor of the plurality of second localized temperature sensors,
a difference is detected for each portion of the plurality of first portions of the chip and a corresponding portion of the plurality of second portions of the chip carrier based on comparison of the first temperature and the second temperature,
each of the plurality of first localized heater elements is configured to generate, based on the detected difference, heat in the respective portion of the plurality of second portions of the chip carrier, and
the difference for each portion of the plurality of second portions is adjusted based on the heat generated in the respective portion of the plurality of second portions of the chip carrier.

9. The electronic device of claim 8, wherein the detected difference is a temperature difference between the first temperature and the second temperature.

10. The electronic device of claim 8, wherein the detected difference is a difference between:

the first temperature after modification of the first temperature by a first coefficient of thermal expansion (CTE) of the chip, and the second temperature after modification of the second temperature by a second CTE of the chip carrier.

11. The electronic device of claim 10, wherein
the chip further includes a silicon material having a CTE of approximately 2.6 parts per million (ppm) per degree Centigrade (C), and
the chip carrier further includes one or more organic laminate materials having a composite CTE of approximately 15 ppm/C.

12. The electronic device of claim 8, wherein
the chip further includes a plurality of second localized heater elements located within a vicinity of the plurality of first localized temperature sensors,
each of the plurality of second localized heater elements is configured to generate, based on the detected difference, heat in the respective portion of the plurality of first portions of the chip, and
the difference for each portion of the plurality of second portions is adjusted based on the heat generated in the respective first portion of the plurality of first portions of the chip.

13. The electronic device of claim 8, wherein
each first localized temperature sensor of the plurality of first localized temperature sensors is an on-chip temperature sensor diode (OCTS), and
each second localized temperature sensor of the plurality of second localized temperature sensors is an OCTS.

14. The electronic device of claim 8, wherein each first localized heater element of the plurality of first localized heater elements is a resistor configured to generate the heat based on application of to a current to the resistor.

15. A chip package, comprising:
a chip having a plurality of first portions and a plurality of first localized temperature sensors, wherein
each portion of the plurality of the first portions corresponds to a respective corner of a plurality of corners of the chip,
each of the plurality of first localized temperature sensors corresponds to a respective portion of the plurality of first portions of the chip, and
each of the plurality of first localized temperature sensors is configured to measure a first temperature of the respective portion of the plurality of first portions of the chip; and a chip carrier coupled to the chip via a plurality of solder connections, wherein
the chip carrier includes a plurality of second portions and a plurality of second localized temperature sensors,
each portion of the plurality of second portions of the chip carrier corresponds to a respective corner of the chip carrier;
each of the plurality of second localized temperature sensors corresponds to a respective portion of the plurality of second portions of the chip carrier,
each of the plurality of second localized temperature sensors is vertically aligned with the respective first localized temperature sensor of the plurality of first localized temperature sensors,
each of the plurality of second localized temperature sensors is configured to measure a second temperature of the respective portion of the plurality of second portions of the chip carrier,
the chip further includes a first localized heater element of a plurality of first localized heater elements within a vicinity of each first localized temperature sensor of the plurality of first localized temperature sensors,
the first localized heater element is configured to generate, based on detected difference between the first temperature and the second temperature, heat in the respective portion of the plurality of first portions of the chip, and
the detected difference for each portion of the plurality of first portions is adjusted based on the heat generated in the respective portion of the plurality of first portions of the chip.

16. The chip package of claim 15, further comprising at least one of an analog electronic circuit or a digital electronic circuit, configured to compare the first temperature and the second temperature to detect the difference.

17. The chip package of claim 15, wherein
the chip carrier further includes a central core, front side level, and a bottom side level, and
each of the plurality of second localized temperature sensors is in the front side level.

18. The chip package of claim 15, wherein each of the plurality of first localized temperature sensors is in a level in a back end of the line (BEOL) of the chip.

* * * * *